United States Patent [19]

Ryczek et al.

[11] Patent Number: 4,521,694

[45] Date of Patent: Jun. 4, 1985

[54] COMPARATOR TIMER WITH DUAL FUNCTION ADJUSTMENT

[75] Inventors: Lawrence J. Ryczek, Nashotah; William J. Janutka, West Allis, both of Wis.

[73] Assignee: Eaton Corporation, Cleveland, Ohio

[21] Appl. No.: 509,952

[22] Filed: Jun. 30, 1983

[51] Int. Cl.³ ............................................. H03K 5/159
[52] U.S. Cl. .................................... 307/266; 307/273; 307/601; 307/608; 328/55; 328/58; 328/207
[58] Field of Search .......................... 328/55, 58, 207; 307/265, 266, 590, 601, 603, 608, 273; 331/108 D, 111, 143

[56] References Cited

U.S. PATENT DOCUMENTS 3,073,972  1/1963  Jenkins ............................. 328/55 X
3,569,842  3/1971  Schroyer ............................... 328/55

OTHER PUBLICATIONS

Graeme, "Applications of Operational Amplifiers", 1973.

Primary Examiner—Siegfried H. Grimm
Attorney, Agent, or Firm—Andrus, Sceales, Starke & Sawall

[57] ABSTRACT

A comparator timer 2 is disclosed in which charging current and threshold trip voltage are both adjusted with a single potentiometer 6. Moving the pot wiper 8 in one direction increases the threshold trip voltage at the reference input terminal 12 of the comparator 4, such as the minus terminal of an operational amplifier, and at the same time decreases the capacitor charging current to the comparing input terminal 16, such as the plus terminal of the op amp, to lengthen the timing interval. Moving the pot wiper 8 in the other direction decreases threshold trip voltage and concurrently increases capacitor charging current to shorten the timing interval. The circuit affords expanded timing range, reduced power consumption and improved adjustment resolution, which are ideal for proximity switch applications, particularly photoelectric type proximity switches.

18 Claims, 4 Drawing Figures

POOR RESOLUTION
IN LOW RANGE

IMPROVED
RESOLUTION

4,521,694

COMPARATOR TIMER WITH DUAL FUNCTION ADJUSTMENT

BACKGROUND AND SUMMARY

The invention provides a comparator timer having a single adjustment means for concurrently changing both charging current and threshold trip voltage. In the preferred embodiment, a single potentiometer adjusts the time delay between input and output signals of the comparator.

The invention is further characterized by expanded timing range, reduced power consumption and improved adjustment resolution with a linear potentiometer.

Though not limited thereto, the timer was developed for proximity switches and is particularly useful in photoelectric type proximity switches for providing a delayed output signal following a given sensed condition. The wide range together with the low power consumption makes the timer ideal for such proximity switch applications.

DETAILED DESCRIPTION

Figure 1:
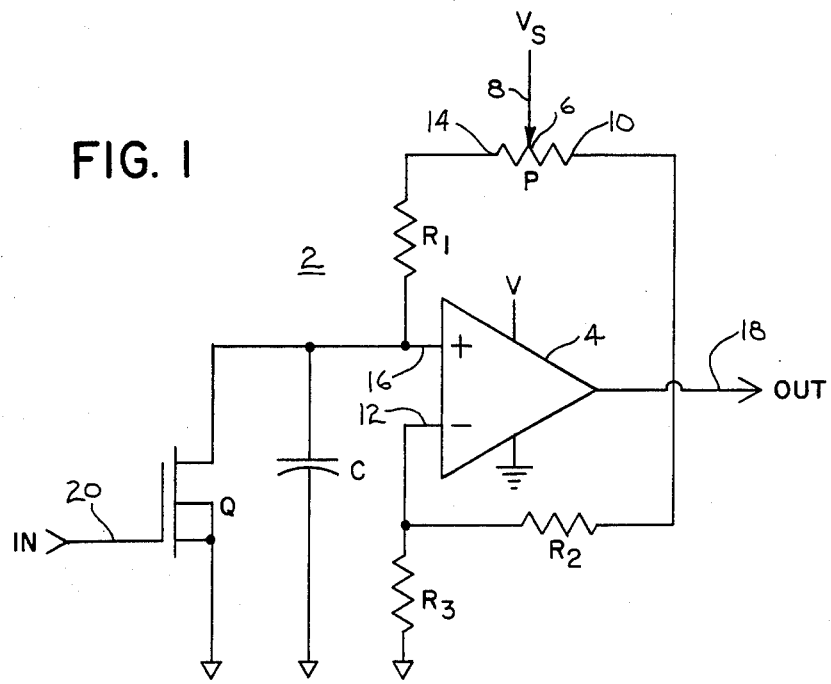
FIG. 1 is a circuit diagram of a comparator timer constructed in accordance with the invention.

There is shown in FIG. 1 a timer 2 comprising in combination comparator means 4 and single means 6 for concurrently changing both charging current and threshold trip voltage for the comparator. Single means 6 is adjusted in one direction to increase charging current and decrease threshold trip voltage, to shorten timing intervals. Single means 6 is adjusted in another direction to decrease charging current and increase threshold trip voltage, to lengthen timing intervals.

In preferred form, means 6 is a potentiometer comprising a voltage source $V_s$ connected through a wiper 8 to a variable point along a pot resistor P. The right end 10 of the pot resistor is connected to a reference threshold input terminal 12 of comparator 4, for example the minus terminal of an operational amplifier. Right end 10 of pot resistor P is preferably connected through a voltage divider network formed by resistors $R_2$ and $R_3$, the junction of which provides a divided voltage to reference input terminal 12. The left end 14 of the pot resistor is connected through an RC circuit, provided by resistor $R_1$ and capacitor C, to a comparing input terminal 16 of the comparator, such as the plus terminal of an operational amplifier, for comparison against reference input terminal 12.

When wiper 8 is moved rightwardly, the threshold trip voltage at reference input terminal 12 is increased, and the charging current to capacitor C is decreased. It thus takes longer for the voltage at comparing input terminal 16 to rise in a given polarity direction above the voltage at reference input terminal 12. There will thus be a longer timing delay until output 18 transitions.

When wiper 8 is moved leftwardly, the threshold trip voltage at reference input terminal 12 is decreased, and the charging current to capacitor C is increased. It thus takes less time for voltage at comparing input terminal 16 to rise above the voltage at reference input terminal 12. There is thus less of a delay before output 18 transitions.

Switch means such as field effect transistor Q is connected in the RC circuit. Switch Q has a first state permitting charging of capacitor C from potentiometer 6. Switch Q has a second state preventing charging of capacitor C to prevent voltage build-up at comparing-input terminal 16. In the disclosed embodiment, switch Q is non-conductive in its first state, and is conductive in its second state to short capacitor C.

Figure 2:
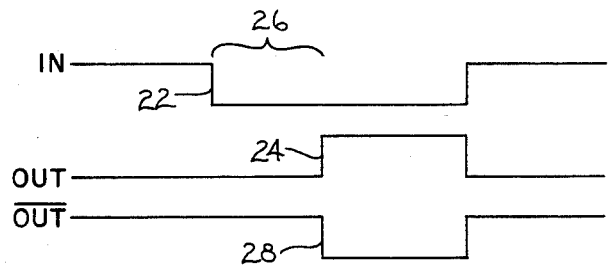
FIG. 2 is a timing diagram illustrating operation of the circuit of FIG. 1.

As seen in FIGS. 1 and 2, an input trigger signal at 20 which transitions low at 22 renders FET Q non-conductive such that capacitor C charges, and voltage increases at comparing input terminal 16 of the comparator. When the voltage at comparing input terminal 16 rises above that at reference input terminal 12, the output of the comparator transitions as shown at 24. The length of the timed delay 26 between the input trigger signal transition 22 and the comparator output transition 24 is set by the adjustment of potentiometer 6.

The connections to the comparator comparing input and reference input terminals 16 and 12 may be interchanged. This yields the opposite polarity transition 28, shown by the $\overline{\text{OUT}}$ timing line in FIG. 2, of the comparator output 18 following the input trigger signal. The circuit thus performs an inverting function without an add-on inverter.

Figures 3, 4:
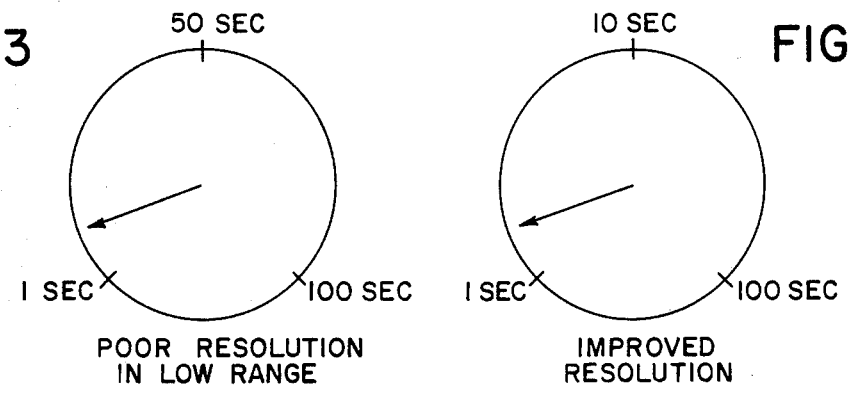
FIGS. 3 and 4 are schematic illustrations contrasting poor resolution in the low range versus the improved resolution afforded by the invention.

The length of the timed delay exhibits logarithmic advance in the setting of the potentiometer and movement of wiper 8. This affords better resolution in the low range. With an adjustable RC timer which has a nonadjustable threshold, FIG. 3, there is poor resolution in the low range. With logarithmic advance, FIG. 4, there is improved resolution in the low range.

The time delay is given by the following Equation.

$$T_d = (R_1 + kP)\, C \ln\left[\frac{R_2 + R_3 + (1-k)P}{R_2 + (1-k)P}\right]$$

$T_d$ is the time delay between the input at 20 and the output at 18. P is the resistance of the potentiometer from point 14 to point 10. k is the fraction of pot resistance from point 14 to wiper 6. The circuit of FIG. 1 provides a multiplying effect, i.e. using a linear potentiometer results in a log function of output $T_d$ versus wiper 8 displacement.

In the particular embodiment disclosed, the resistors are applied in the following ratio: $R_1 = R_2 = P/10 = 6.25 R_3$, such that a 100 to 1 timing ratio is obtained by adjusting wiper 8 end to end. The potentiometer is linear, and the timed delay when the wiper is in its leftmost position is a decade faster than when the wiper is in its center position. The timed delay when the wiper is in its rightmost position is a decade slower than when the wiper is in its center position.

The use of FET Q is preferred because it has a low ON resistance and will completely discharge capacitor C. This minimizes any first cycle effect.

It is recognized that various modifications are possible within the scope of the appended claims.

We claim:

1. A timer comprising in combination comparator means having a comparing input terminal connected to an RC charging current circuit, and a reference threshold input terminal, and comparing voltage at said comparing input terminal due to said charging current against threshold trip voltage at said reference terminal, and single means for concurrently changing both charging current and threshold trip voltage for said comparator means.

2. The invention according to claim 1 wherein said single means is adjusted in one direction to increase charging current and decrease threshold trip voltage to shorten timing intervals, and wherein said single means is adjusted in another direction to decrease charging current and increase threshold trip voltage to lengthen timing intervals.

3. The invention according to claim 2 wherein said single means comprises single potentiometer means.

4. The invention according to claim 3 wherein:
said potentiometer means comprises a voltage source connected through a wiper to a variable point along a pot resistor;
the right end of said pot resistor is connected to said reference threshold input terminal of said comparator means;
the left end of said pot resistor is connected through said RC circuit, comprising a resistor R and a capacitor C, to said comparing input terminal of said comparator means for comparison against said reference input terminal;
such that when said wiper is moved rightwardly, the threshold trip voltage at said reference input terminal is increased, and the charging current to said capacitor C is decreased, such that it takes longer for the voltage at said comparing input terminal to rise in a given polarity direction above the voltage at said reference input terminal; and
such that when said wiper is moved leftwardly, the threshold trip voltage at said reference input terminal is decreased, and the charging current to said capacitor C is increased, such that it takes less time for voltage at said comparing input terminal to rise in a given polarity direction above the voltage at said reference input terminal.

5. The invention according to claim 4 wherein said right end of said pot resistor is connected through a voltage divider network to said reference input terminal of said comparator means.

6. The invention according to claim 4 comprising switch means in said RC circuit, said switch means having a first state permitting charging of said capacitor C from said potentiometer means, said switch means having a second state preventing charging of said capacitor C to prevent voltage build-up at said comparing input terminal.

7. The invention according to claim 6 wherein said switch means is non-conductive in said first state, and is conductive in said second state to short said capacitor C.

8. The invention according to claim 6 wherein an input trigger signal transition of given polarity activates said switch means to said first state such that voltage increases at said comparing input terminal of said comparator means, and when the voltage at said comparing input terminal rises in a given polarity direction above that at said reference input terminal the output of said comparator means transitions, the length of the timed delay between said input trigger signal transition and said comparator means output transition being set by the adjustment of said potentiometer means.

9. The invention according to claim 8 wherein the connection to said comparator means comparing input terminal and reference input terminal are interchangeable, to yield the opposite polarity transition of said comparator means output following said input trigger signal transition, whereby to perform an inverting function without an add-on inverter.

10. The invention according to claim 8 wherein the length of said timed delay exhibits logarithmic advance in the setting of said potentiometer means and movement of said wiper, affording better resolution in the low range.

11. The invention according to claim 10 wherein said potentiometer means is linear, and said circuit provides a multiplying effect resulting in a log function of said timed delay versus displacement of said wiper.

12. The invention according to claim 11 wherein:
said right end of said pot resistor P is connected through a voltage divider network to said comparator means reference input terminal;
said voltage divider network includes resistors $R_2$ and $R_3$;
said RC circuit includes a resistor $R_1$;
said potentiometer means is linear;
the timed delay $T_d$ between said input trigger signal transition and said comparator means output transition is given by the following equation $$T_d = (R_1 + kP) \, C \ln \frac{R_2 + R_3 + (1 - k)P}{R_2 + (1 - k)P}$$

where P is the resistance of said pot resistor end to end, and k is the fraction of pot resistance from one end of said pot resistor to said wiper.

13. The invention according to claim 10 wherein:
said right end of said pot resistor P is connected through a voltage divider network to said comparator means reference input terminal;
said voltage divider network includes resistors $R_2$ and $R_3$;
said RC circuit includes a resistor $R_1$;
said resistors are applied in the following ratios $R_1 = R_2 = P/10 = 6.25 \, R_3$, such that a 100 to 1 timing ratio is obtained by adjusting said wiper end to end;
said potentiometer means is linear;
such that said timed delay when said wiper is in its leftmost position is a decade faster than when said wiper is in its center position; and
such that said timed delay when said wiper is in its rightmost position is a decade slower than when said wiper is in its center position.

14. A timer comprising in combination:
comparator means having plus and minus input terminals, one terminal being a reference threshold input terminal and the other terminal being a comparing input terminal, said comparator means having an output which transitions in response to the voltage at said comparing input terminal rising in a given polarity direction above a threshold trip voltage at said reference input terminal;
potentiometer means comprising a voltage source connected through variable resistance means to each of said comparator input terminals, one of said terminals including a charging current capacitor C, such that adjustment of said potentiometer means in one direction increases threshold trip voltage and decreases charging current, to lengthen the delay until said output transitions, and such that adjustment of said potentiometer in another direction decreases threshold trip voltage and increases charging current, to shorten the delay until said output transitions.

15. The invention according to claim 14 wherein said comparator means comprises an operational amplifier.

16. The invention according to claim 14 comprising a field effect transistor connected to said capacitor C and shorting the latter in a low resistance ON state to completely discharge said capacitor C and minimize first cycle start-up effects.

17. The invention according to claim 14 wherein said variable resistance is a pot resistor having a wiper moved therealong from a voltage source, the right end of said pot resistor being connected through a voltage divider network to said minus terminal as the reference input terminal, the left end of said pot resistor being connected in circuit with said capacitor C to the plus terminal as the comparing input terminal, and wherein said connections to said plus and minus terminals may be interchanged to yield the opposite polarity transition of said comparator output.

18. A proximity switch timer comprising in combination comparator means and potentiometer means for concurrently changing both charging current and threshold trip voltage for said comparator means, said potentiometer means comprising a voltage source connected through a wiper to a variable point along a pot resistor, the right end of said pot resistor being connected to a reference threshold input terminal of said comparator means, the left end of said pot resistor being connected through an RC circuit comprising a resistor R and a capacitor C, to a comparing input terminal of said comparator means for comparison against said reference input terminal, such that when said wiper is moved rightwardly, the threshold trip voltage at said reference input terminal is increased, and the charging current to said capacitor C is decreased, such that it takes longer for the voltage at said comparing input terminal to rise in a given polarity direction above the voltage at said reference input terminal, such that when said wiper is moved leftwardly, the threshold trip voltage at said reference input terminal is decreased, and the charging current to said capacitor C is increased, such that it takes less time for the voltage at said comparing input terminal to rise in a given polarity direction above the voltage at said reference input terminal.

* * * * *